(12) United States Patent
Lesso (10) Patent No.: US 12,453,493 B2
(45) Date of Patent: Oct. 28, 2025

(54) MEASUREMENT CIRCUITRY

(71) Applicant: Cirrus Logic International Semiconductor Ltd., Edinburgh (GB)

(72) Inventor: John P. Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 968 days.

(21) Appl. No.: 17/518,962

(22) Filed: Nov. 4, 2021

(65) Prior Publication Data
US 2023/0134523 A1    May 4, 2023

(51) Int. Cl.
*A61B 5/145* (2006.01)
*A61B 5/1468* (2006.01)

(52) U.S. Cl.
CPC ...... *A61B 5/14532* (2013.01); *A61B 5/14546* (2013.01); *A61B 5/1468* (2013.01)

(58) Field of Classification Search
CPC .... G01N 27/416; G01R 17/105; G01R 27/22; A61B 5/14532; A61B 5/14546; A61B 5/1468
See application file for complete search history.

(56) References Cited

U.S. PATENT DOCUMENTS

| | | | | |
|---|---|---|---|---|
| 4,703,756 A | * | 11/1987 | Gough | A61B 5/14865 |
| 9,979,407 B1 | * | 5/2018 | Carneiro | G02B 26/005 |
| 2004/0061559 A1 | * | 4/2004 | Charlon | H03L 7/189 331/17 |
| 2010/0099960 A1 | * | 4/2010 | Caduff | A61B 5/05 600/316 |
| 2011/0265553 A1 | | 11/2011 | Dimmler et al. | |
| 2012/0150000 A1 | * | 6/2012 | Al-Shamma'a | H01P 3/003 600/309 |
| 2012/0235757 A1 | * | 9/2012 | Trivedi | H03B 5/1228 331/117 FE |
| 2014/0300206 A1 | * | 10/2014 | Moes | H02J 50/10 307/104 |
| 2018/0316310 A1 | * | 11/2018 | Pentakota | H03B 5/1212 |
| 2019/0113476 A1 | | 4/2019 | Coln et al. | |

OTHER PUBLICATIONS

International Search Report and Written Opinion of the International Searching Authority, International Application No. PCT/GB2022/052742, mailed Jan. 13, 2023.
Quintero, Andres et al., "A VCO-Based CMOS Readout Circuit for Capacitive MEMS Microphones", SENSORS, vol. 19, No. 19, Sep. 24, 2019, p. 4126.
Chen, Keming, "A Novel Implementation of Concurrent Sensing in Sweat or Blood", Sep. 2, 2021, pp. 1-87, https://darylma.com/wp-content/uploads/2021/09/CHEN_Keming_A-Novel-implementation-of-Concurrent-Metabolite-Sensing-in-Sweat-or-Blood-2.pdf.
Definition of Half bridge, Wikipedia, retrieved May 2, 2025 from https://en.wikipedia.org/w/index.php?title=Half_bridge&oldid=1070856903.

* cited by examiner

*Primary Examiner* — Jennifer Wecker
*Assistant Examiner* — Jonathan Bortoli
(74) *Attorney, Agent, or Firm* — Jackson Walker L.L.P.

(57) ABSTRACT

Measurement circuitry comprising: a first half bridge, comprising: a first impedance coupled between an input voltage node for receiving an input voltage and a first node; and a second impedance coupled between the first node and a reference voltage node, the first impedance or the second impedance comprising a first voltage-controlled oscillator (VCO) having a first input coupled to the first node and a first output for outputting a first oscillating signal having a first frequency proportional to a current flowing in the half bridge.

18 Claims, 11 Drawing Sheets

MEASUREMENT CIRCUITRY

TECHNICAL FIELD

The present disclosure relates to circuitry and methods for measuring impedance.

BACKGROUND

Impedance sensors are used in many applications to monitor and/or detect changes in a variable which affects impedance. An example application is in electrochemical sensing, where electrochemical sensors are widely used for the detection of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes.

Conventional drive and measurement circuitry for detecting impedance and changes therein, typically comprises several amplifiers, feedback and/or feedback loops in addition to other processing circuitry, such as analog-to-digital converters (ADCs). Such circuitry can take up a large amount of space on-chip, as well as being relatively process intensive, thereby utilising large amounts of power. When such measurement circuitry is battery powered, it is desirable for such circuitry to be as small as possible and use as little power as possible.

SUMMARY

According to a first aspect of the disclosure, there is provided measurement circuitry comprising: a first half bridge, comprising: a first impedance coupled between an input voltage node for receiving an input voltage and a first node; and a second impedance coupled between the first node and a reference voltage node, the first impedance or the second impedance comprising a first voltage-controlled oscillator (VCO) having a first input coupled to the first node and a first output for outputting a first oscillating signal having a first frequency proportional to the current flowing in the half bridge.

The first impedance may comprise a first electrochemical cell.

The measurement circuitry may further comprise: a first counter, comprising: a data input for receiving the first output; a clock input for receiving a clock signal; and a counter output, the data input clocked by the clock input.

The measurement circuitry may further comprise: a second half bridge, comprising: a third impedance coupled between the input voltage node and a second node; and a fourth impedance coupled between the second node and the reference voltage node. The third impedance or the fourth impedance may comprise a second voltage-controlled oscillator (VCO) having a second input coupled to the second node and a second output for outputting a second oscillating signal having a second frequency.

The third impedance may comprise a second electrochemical cell.

The measurement circuitry may further comprise: a difference module configured to: receive the first and second oscillating signals; and generate a difference signal proportional to the difference between the first and second frequencies.

The difference module may comprise: a first counter having a first data input for receiving the first oscillating signal and a first clock input for receiving a clock signal, the first counter configured to generate a first count signal; a second counter having a second data input for receiving the second oscillating signal and a second clock input for receiving the clock signal, the second counter configured to generate a second count signal; and a subtraction module configured to subtract one from the other to generate the difference signal.

A gain compensation module may be provided. The gain compensation module may comprise: an adder configured to combine the first and second count signals to generate a common mode signal; and a gain compensation module configured to normalise a gain, k, in the difference signal associated with the first and second VCOs using the common mode signal.

The gain, k, may be defined as:

$$k = \frac{2V_{in} - S_{cm}}{2Z_0 * V_{in}^2}$$

where Vin is the input voltage, Scm is the common mode signal, and Z0 is the value of the first impedance or the third impedance.

The measurement circuitry may further comprise: a first linearisation module configured to linearise the first count signal provided to the subtraction module based on the input voltage and a first gain, k1, of the first VCO; and a second linearisation module configured to linearise the second count signal provided to the subtraction module based on the input voltage and a second gain, k2, of the second VCO.

The measurement circuitry may further comprise: a counter, comprising: a data input configured to receive the first oscillating signal; and a clock input configured to receive the second oscillating signal, wherein the data input is clocked by the clock input.

The measurement circuitry may further comprise: a frequency divider, the frequency divider configured to frequency divide the first oscillating signal or the second oscillating signal.

The first and second potential dividers may be arranged as an unbalanced bridge.

The measurement circuitry may be configured to operate in a low-power mode in which a plurality of MOSFETs of the first VCO are configured to operate in a subthreshold region.

During operating in the subthreshold mode, the plurality of MOSFETs may comprise at least one NMOS device having a bulk and a drain connected to one another. Additionally or alternatively, at least one NMOS device may have a bulk and a gate connected to one another. Additionally or alternatively, at least one NMOS device may have a bulk connected to a supply voltage.

During operating in the subthreshold mode, the plurality of MOSFETs may comprise at least one PMOS device having a bulk and a drain connected to one another. Additionally or alternatively, at least one PMOS device may have a bulk and a gate connected to one another. Additionally or alternatively, at least one PMOS device may have a bulk connected to reference voltage, e.g. ground (GND).

The first VCO may comprises a ring oscillator.

The electrochemical cell may be configured to sense one or more analytes. The analytes may be selected from a list comprising glucose, one or more lactates, and one or more ketones.

According to another aspect of the disclosure, there is provided a continuous glucose monitor comprising the measurement circuitry described above.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Figure 1:
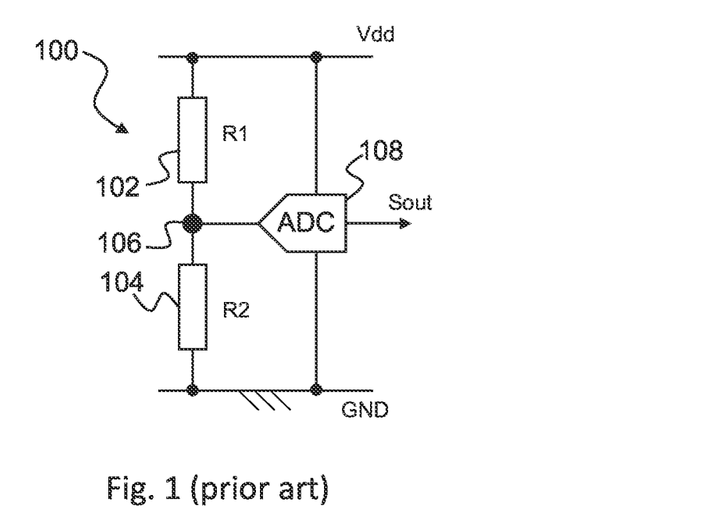
FIG. 1 is a schematic diagram of a state-of-the-art measurement circuit.

FIG. 1 is schematic diagram of a known voltage divider circuit 100. The circuit 100 comprises a first resistor 102 and a second resistor 104 having respective resistances R1, R2. The first and second resistors 102, 104 are connected in series between a supply voltage Vdd and a reference node, in this case ground GND. The first and second resistors 102, 104 are connect to each other at a measurement node 106. As is known in the art, the voltage between the reference node GND and the measurement node 106 is dependent on ratio of the resistances R1, R2 of the first and second resistors 102, 104. An input of an analog-to-digital converter (ADC) 108 is connected to the measurement node 106 to convert the voltage at the measurement node 106 to a digital representation Sout which can then be processed by a digital signal processor (DSP) or other digital device. To function, the ADC 108 requires power and is thus also coupled to the supply voltage Vdd, although the ADC 108 may alternatively be coupled to a separate supply voltage (not shown). The voltage divider circuit 100 shown in FIG. 1 comprising the first and second resistors 102, 104 is also known in the art as a half bridge or a potential divider.

The circuit 100 shown in FIG. 1 is commonly used in the art to measure changes in impedance. In such applications, the first and/or second resistors 102, 104 are replaced with elements under test having an impedance which varies with variations in some internal or external condition. A disadvantage of the circuit 100 when used in combination with a digital system is that a constant supply voltage Vdd needs to be provided to the resistor pair 102, 104 as well as to the ADC 108. When used as for measurement in battery operated systems, this can lead to excessive use of power.

Embodiments of the present disclosure aim to address or at least ameliorate one or more of the above problems by replacing the ADC 108 and the second resistor 104 with a voltage-controlled oscillator (VCO).

Figure 2:
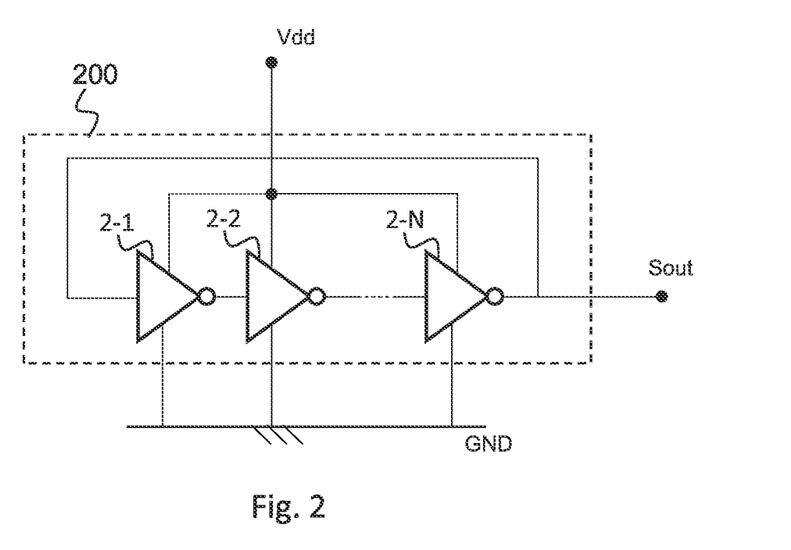
FIG. 2 is a schematic diagram of a state-of-the-art voltage-controlled ring oscillator.

FIG. 2 is schematic diagram of a voltage-controlled oscillator (VCO) 200 comprising an odd number of N inverters 2-1, 2-2, 2-N connected in series. The output of the Nth inverter 2-N is coupled to the input of the first inverter 2-1 in the string as well as the output of the VCO 200. Since each inverter computes the logical NOT of its input, the output of the Nth inverter 2-N is the logical NOT of the input to the first inverter 2-1. Each of the inverter 2-1, 2-2, 2-N imparts a delay on the input signal which is compounded at the output of the Nth inverter. Due to this delay, the feedback of the output of the Nth inverter 2-N to the input of the first inverter 2-1 causes oscillation in the output signal Sout. The delay associated with each of the inverters 2-1, 2-2, 2-N is dependent on the supply voltage Vdd. Thus, as the supply voltage Vdd varies, so too does the frequency of oscillation of the VCO 200.

Thus, the oscillating output of the VCO 200 is a digital representation of the voltage Vdd. Thus, the output signal Sout can be used to determine the level of the supply voltage Vdd.

Figure 3:
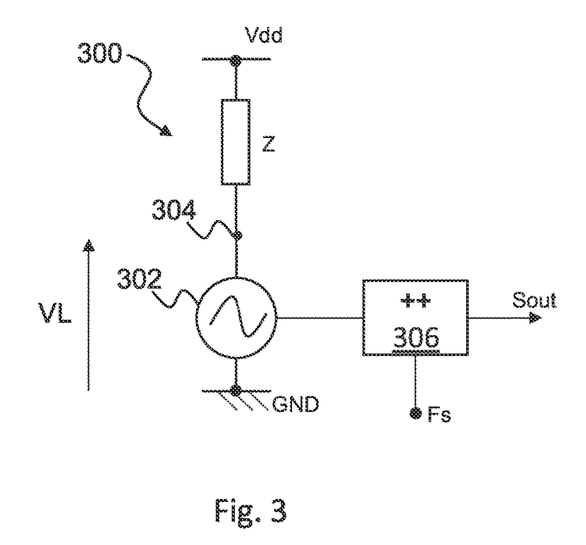
FIG. 3 is a schematic diagram of a measurement circuit in accordance with embodiments of the present disclosure.

FIG. 3 is a schematic diagram of a measurement circuit 300 according to embodiments of the present disclosure. The measurement circuit 300 is in the form of a half bridge comprising an impedance Z (such as an impedance under test) coupled in series with a VCO 302, such as the VCO 200 shown in FIG. 2. The impedance Z is coupled between a supply voltage Vdd and a measurement node 304. The VCO 302 is coupled between the measurement node 304 and a reference voltage, in this case ground GND (nominally zero volts). Thus, VCO 302 generates an oscillating output signal, the frequency of which is proportional to the voltage VL across the VCO 302 and thus the voltage at the measurement node 304. Variations in the impedance Z lead to variations in the voltage drop across the impedance Z and thus the voltage drop VL across the VCO 302.

To decode the output signal from the VCO 302, the measurement circuit 300 may further comprise a counter 306 having a data input for receiving the output signal from the VCO 302 and a clock input for receiving a clock signal. The counter 302 generates a decoded output signal Sout.

Figure 4:
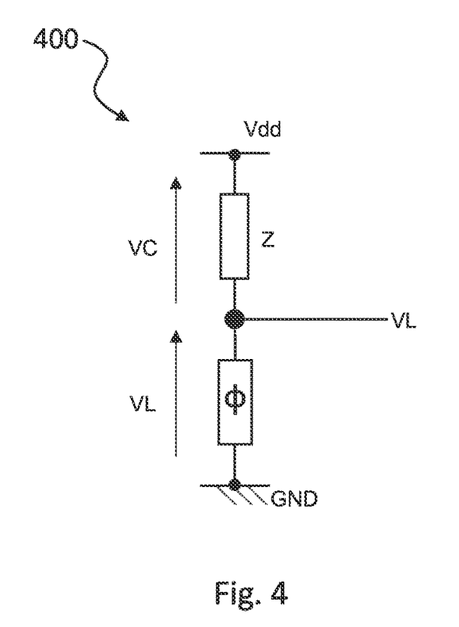
FIG. 4 is an equivalent circuit of the measurement circuit shown in FIG. 3.

FIG. 4 is a schematic diagram of an equivalent circuit 400 to the measurement circuit 300 shown in FIG. 3. The VCO 302 can be modelled as a voltage controlled non-linear current source φ. It will be appreciated that φ may take various forms depending on the characteristics of the VCO 302. In the following non-limiting example, a parabolic form is described, for illustrative purposes only. The voltage controlled non-linearity is in the form:

$$\varphi(V_L) = kV_L^2$$

Where VL is the voltage drop across the non-linear current source φ.

Figure 5:
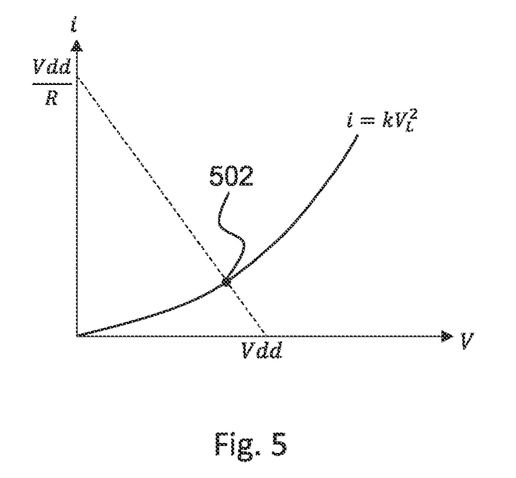
FIG. 5 is a load line plot for the measurement circuit shown in FIG. 3.

A load line plot can be drawn as shown in FIG. 5. The stable operating point 502, where the load line intersects the current vs voltage curve for the VCO 302. From this, an equation for Vdd can be derived as shown below.

$$Vdd = Z\varphi(V_L) + V_L$$

This gives rise to the following quadratic equation which can be solved to find $V_L$, which is the voltage drop across the VCO 302.

$$0 = kZV_L^2 + V_L - Vdd$$

The voltage $V_L$ across the VCO 302 is given by the solution to the above equation.

Figure 6:
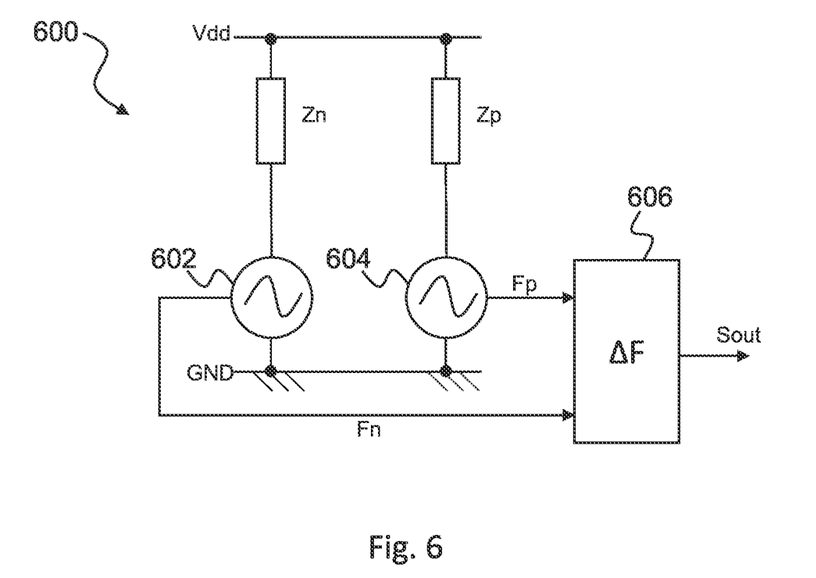
FIG. 6 is a schematic diagram of a measurement circuit in accordance with embodiments of the present disclosure.

FIG. 6 is a schematic diagram of another measurement circuit 600. The measurement circuit 600 comprises a modified Wheatstone full bridge in which two resistors have each been replaced with voltage-controlled oscillator. Specifically, the measurement circuit 600 comprises a first impedance Zn, a second impedance Zp, a first VCO 602 and a second VCO 604. The first impedance Zn is coupled between a supply voltage Vdd and the first VCO 602, for example to a supply rail of the first VCO 602. The first VCO 602 is also coupled to a reference node, in this example ground GND. The second impedance Zp is coupled between a supply voltage Vdd and the second VCO 604, for example to a supply rail of the second VCO 604. The second VCO 604 is also coupled to the reference node. Like the half bridge circuit 300 shown in FIG. 3, as the impedances Zn, Zp change, the voltage drop across each of those impedances Zn, Zp also change. In turn, the voltage drop across each of the first and second VCOs 602, 604 changes thereby changing the frequency of oscillation of respective output signals Fn, Fp from the first and second VCOs 602, 604.

The measurement circuit 600 further comprises a difference module 606 configured to output a signal Sout representing the difference in frequency of the first and second output signals Fn, Fp generated by the first and second VCOs 602, 604.

Thus, the output signal Sout is a digital signal which varies in dependence on the first and second impedances Zn, Zp. Specifically, under the condition that k*R<1, the output signal Sout may be defined by the following equation.

$$Sout = k(Z_N - Z_P)V_{dd}^2$$

Where k is the gain associated with each of the first and second VCOs 602, 604. Hence, any change in the impedances Zn or Zp may be detected.

It will be appreciated that in practice, the gain k of each of the first and second VCOs 602, 604 may differ slightly due to analog mismatch and/or device variation between the first and second VCOs 602, 604. Embodiments of the present disclosure may take into account such variation by testing the circuit 600 during a calibration phase. It will also be appreciated that the gain k is a function of the region of operation of transistors (e.g. MOSFETs) in the first and second VCOs 602, 604. As will be described in more detail below, depending on the mode of operation of the measurement circuit 600, MOSFETs of the first and second VCOs 602, 604 may be operated in any suitable mode, e.g. a strongly or fully saturated mode or a sub-threshold mode. The value of the gain k will be different when operating in each of these modes. These differences may be taken into account when processing the output signal Sout.

The measurement circuit 600 shown in FIG. 6 may be operated in two different modes—a balanced mode or an unbalanced mode. In the unbalanced mode, the first impedance Zn is a fixed reference impedance and the second impedance Zp is the impedance under test. The modified Wheatstone bridge is therefore unbalanced. In the balanced mode, the first and second impedances Zn, Zp are both impedance under test and configured such that a change in an external condition causes the first impedance Zn to vary in a substantially equal and opposite way to the second impedance Zp. The relationship between Zp, Zn and Sout in the balanced and unbalanced modes is summarised in the following table.

| Mode | Zp | Zn | Sout |
| --- | --- | --- | --- |
| Balanced | Zref | Zref + ΔZ | k*ΔZ*Vdd² |
| Unbalanced | Zref − ΔZ | Zref + ΔZ | 2k*ΔZ*Vdd² |

It can be seen that by operating the measurement circuit 600 in the balanced mode, the variation in output signal Sout is double that when operating the measurement circuit 600 in the unbalanced mode.

Figure 7:
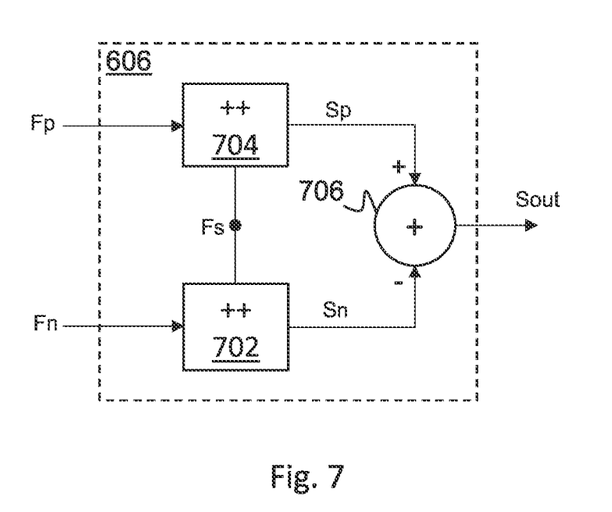
FIGS. 7, 8, and 9 are schematic diagrams of example implementations of a difference module such as that shown in FIG. 6.

FIG. 7 shows an example implementation of the difference module 606. The difference module comprises a first counter 702, a second counter 704 and a subtraction module 706. The first counter 702 has a data input configured to receive the output signal Fn from the first VCO 602. The second counter 704 has a data input configured to receive the output signal from the second VCO 604. The first and second counters 702, 704 each have a clock input configured to receive a common clock signal Fs. First and second count signals output from the first and second counters 702, 704 are provided to the subtraction module 706 which is configured to subtract the second count signal from the first count signal to generate the output signal Sout. In other embodiments, the subtraction module 706 may subtract the first count signal from the second count signal to generate the output signal Sout.

Figure 8:
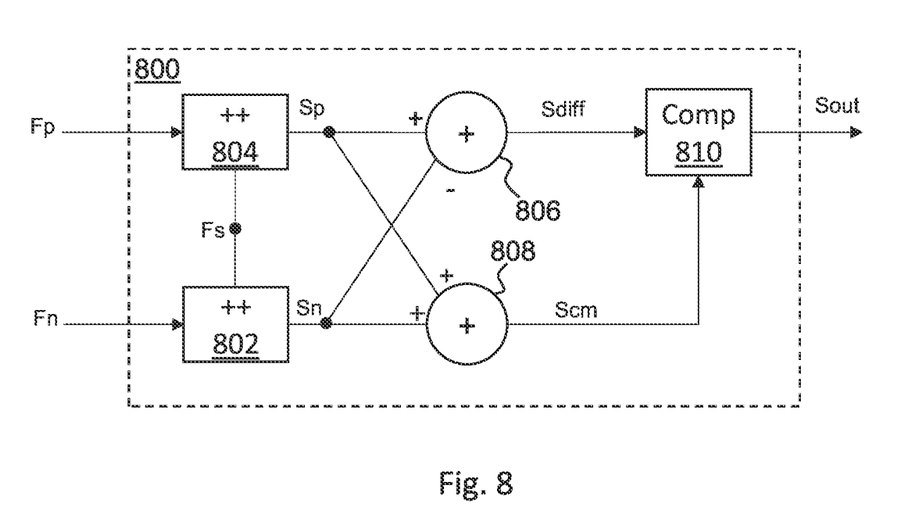

FIG. 8 schematically illustrates a difference module 800 which is a variation of the difference module 606 shown in FIG. 7. In this example, the difference module 800 is configured to determine a difference signal and a common mode signal from the first and second count signals. Using these signals, the gain k associated with the measurement circuit 600 can be determined and the output signal compensated to take into account such gain k.

The difference module 800 comprises a first counter 802, a second counter 804, a subtraction module 806, an adder 808 and a gain compensation module 810. The first counter 802 has a data input configured to receive the output signal Fn from the first VCO 602. The second counter 804 has a data input configured to receive the output signal from the second VCO 604. The first and second counters 802, 804 each have a clock input configured to receive a common clock signal Fs. First and second count signals output from the first and second counters 802, 804 are provided to the subtraction module 806 which is configured to subtract the second count signal from the first count signal to generate a difference signal Sdiff. The first and second count signals are also provided to the adder 808 which is configured to combine the first and second count signals to form a common mode signal Scm. The common mode signal Scm and the difference signal Sdiff are provided to the gain compensation module 810. Based on the common mode signal Scm, the gain compensation module 810 is configured to adapt the difference signal Sdiff to compensate for gain associated with the first and second VCOs 602, 604.

In this configuration, the difference signal Sdiff is given by:

$$Sdiff = k(Z_N - Z_P)V_{dd}^2$$

The common mode signal Scm is given by:

$$Scm = V_{dd}^2 \{k(Z_N - Z_P)V_{dd} - 2\}$$

When operating in the balanced mode (discussed above):

$$Zp = Zo + \Delta Z$$
$$Zn = Zo - \Delta Z$$

Hence:

$$Scm = 2V_{dd}(kZoV_{dd} - 1)$$
$$k = \frac{2V_{dd} - Scm}{2ZoV_{dd}^2}$$

Thus, with knowledge of the common mode voltage Scm, the supply voltage Vdd and the reference impedance Zo, it is possible to derive the gain k of the measurement circuit 600. The gain compensation module may then normalise the gain in the difference signal Sdiff and output a gain compensated output signal Sout.

Figure 9:
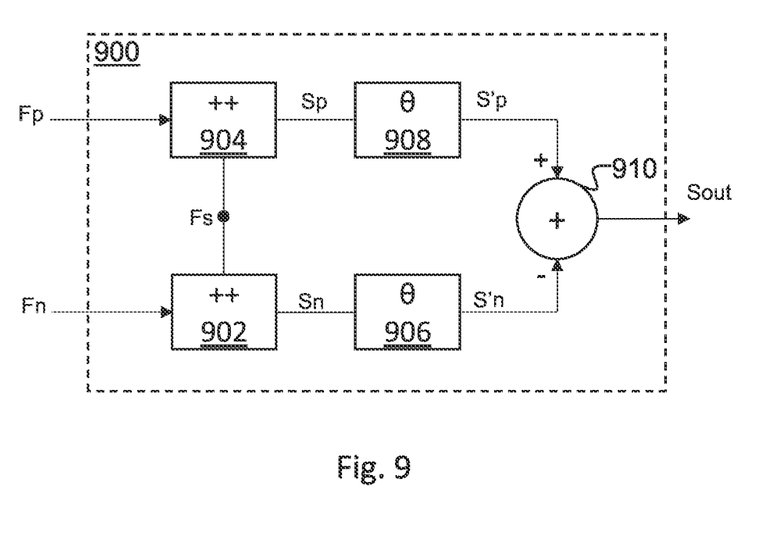

FIG. 9 schematically illustrates a difference module 900 which is a variation of the difference module 606 shown in FIG. 7. As noted above, the current flow through each VCO 602, 604 as exemplified in the graphical illustration of FIG. 5. The difference module 900 may be configured to correct for such non-linearity in signals output from the VCOs 602, 604.

The difference module 900 comprises first and second counters 902, 904, first and second linearisation modules 906, 908 and a subtraction module 910. The first counter 902 has a data input configured to receive the output signal Fn from the first VCO 602. The second counter 904 has a data input configured to receive the output signal from the second VCO 604. The first and second counters 902, 904 each have a clock input configured to receive a common clock signal Fs. First and second count signals Sn, Sp are respectively provided to the first and second linearisation modules 906, 908 which are each configured to linearise the first and second count signals Sn, Sp respectively. Each linearisation module 906, 908 may be configured to perform the following function on respective first and second count signals Sn, Sp. The term "S" has been used as a generalisation of "Sn" and "Sp". This equation was linearised using a Padé approximant.

$$S' = \frac{V_{dd} - S}{kS^2}$$

It will be appreciated that both the supply voltage Vdd and the gain k need to be known to generate the first and second linearised signals S'n, S'p. The supply voltage Vdd can either be measured or known in advance. The gain k may be calculated, for example, using the method described above with reference to FIG. 8. Alternatively, the gain k may be estimated or determined through calibration.

The first and second linearised count signals S'n, S'p are then provided to the subtraction module 910 which is configured to subtract the first linearised count signal S'n from the second linearised count signal S'p (or vice versa) and generate a linearised output signal Sout.

It will be appreciated that one or more elements of the difference module 800 may be combined with one or more elements of the difference module 900 to provide both gain compensation and linearisation. For example, the linearisation modules 906, 908 of the difference module 900 may be provided directly after the first and second counters 802, 804 of the difference module 800 so that the signal provided to the subtraction module 806 and the added 808 are adjusted to remove or ameliorate non-linearities.

In embodiments described above, various counters 702, 704, 802, 804, 902, 904 are clocked with an external clock signal Fs. In some embodiment, however, it may be advantageous not to require an external frequency reference (e.g. clock signal Fs).

Figure 10:
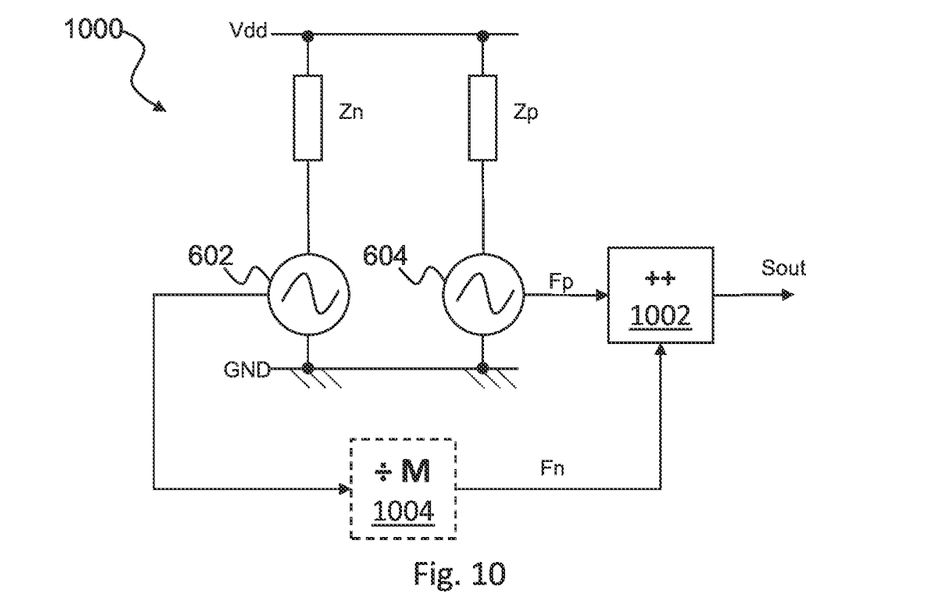
FIG. 10 is a schematic diagram of a measurement circuit in accordance with embodiments of the present disclosure.

FIG. 10 is a schematic diagram of a measurement circuit 1000 which is a variation of the measurement circuit 600 shown in FIG. 6, where like parts have been given like numerals. In the measurement circuit 1000, one half of a modified Wheatstone bridge is used to generate a frequency reference. Like the measurement circuit 600, the measurement circuit 1000 comprises the first and second VCOs 602, 604, the first and second impedances Zn, Zp. Additionally, the measurement circuit 1000 comprises a counter 1002 and optionally a frequency divider 1004. The counter 1002 has a data input and a clock input.

In this embodiment, the first impedance Zn is a fixed reference impedance and the second impedance Zp is an impedance under test. The first VCO output signal Fn from the first VCO 602 is provided to the clock input of counter 1002. The second VCO output signal Fp from the second VCO 604 is provided to the data input of the counter 1002. As such, the first VCO output signal Fn is configured to clock the counter 1002. By clocking one of the oscillating output signals Fn, Fp by the other of the output signals Fn, Fp the output Sout from the counter 1002 represents a ratio of the two clocks, i.e.:

$$Sout = \frac{V_{dd}kZ_P - 1}{V_{dd}kZ_N - 1}$$

The frequency divider 1004 is optionally provided to divide the frequency output from the first VCO 602 by a denominator M, thereby increasing the frequency ratio between the first and second VCO output signals Fn, Fp. Optionally, instead of or in addition to the frequency divider 1004, the sensitivity of the first VCO 602 may be reduced. For example, the gain k of the first VCO 602 may be reduced such that a higher voltage is needed to operate the first VCO 602 at the same frequency, thereby reducing the sensitivity of the first VCO 602.

In a variation of the embodiment shown in FIG. 10, instead of dividing the output signal Fn from the first VCO 602, a frequency divider may be provided between the second VCO 604 and the counter 1002 to divide down the second output signal Fp.

Figure 11:
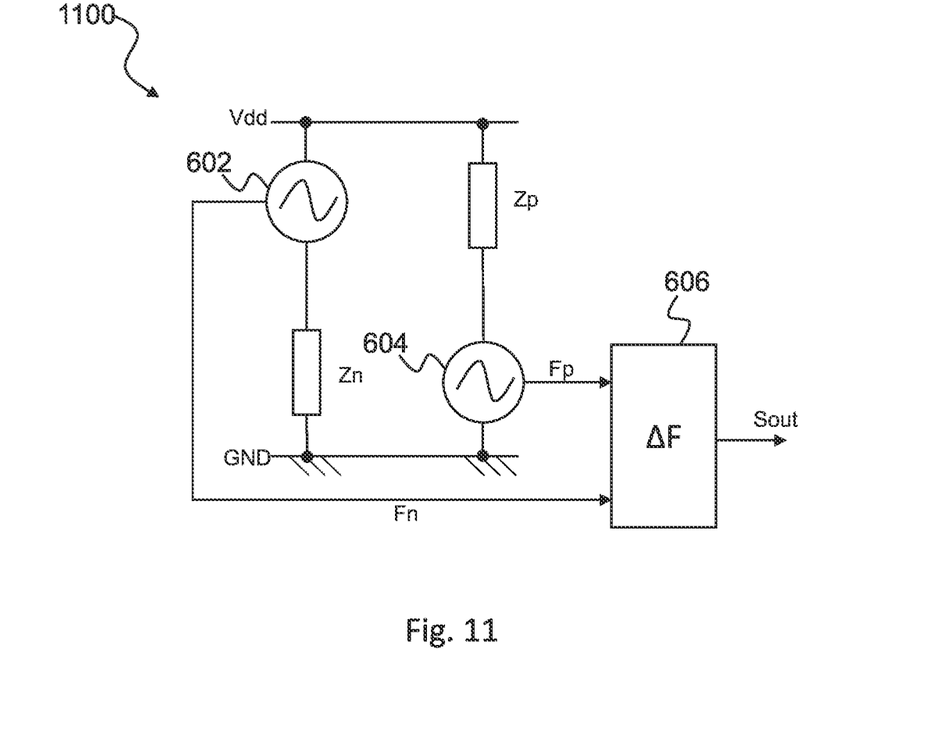
FIG. 11 is a schematic diagram of a measurement circuit in accordance with embodiments of the present disclosure.

FIG. 11 is a schematic diagram of a measurement circuit 1100 which is a skew variant of the measurement circuit 600 shown in FIG. 6. In contrast to the measurement circuit 600 of FIG. 6, the first VCO 602 is coupled between the supply voltage Vdd and the first impedance Zn, and the first impedance Zn is coupled between the reference node GND and the first VCO 602. The measurement circuit 1100, operating as a skew bridge, may result in a more stable common mode signal Scm, which in turn may make it easier to estimate the effective gain k of the conversion process.

Figure 12:
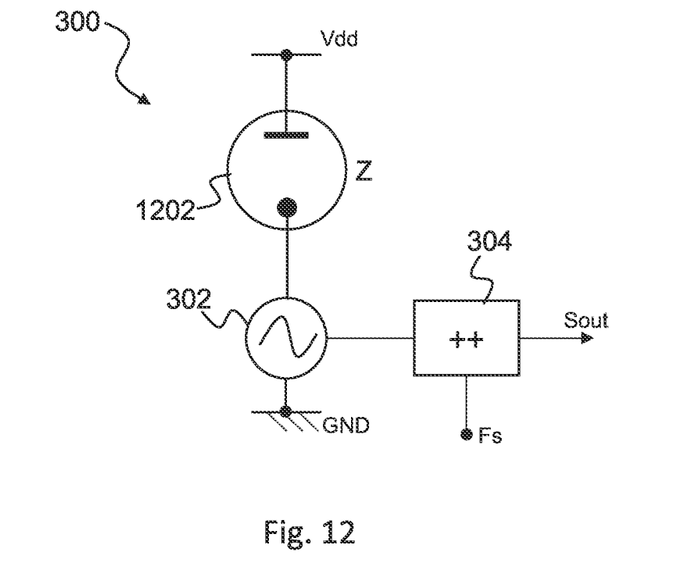
FIG. 12 illustrates an example implementation of the measurement circuit of FIG. 3 as an analyte sensor.
Figure 13:
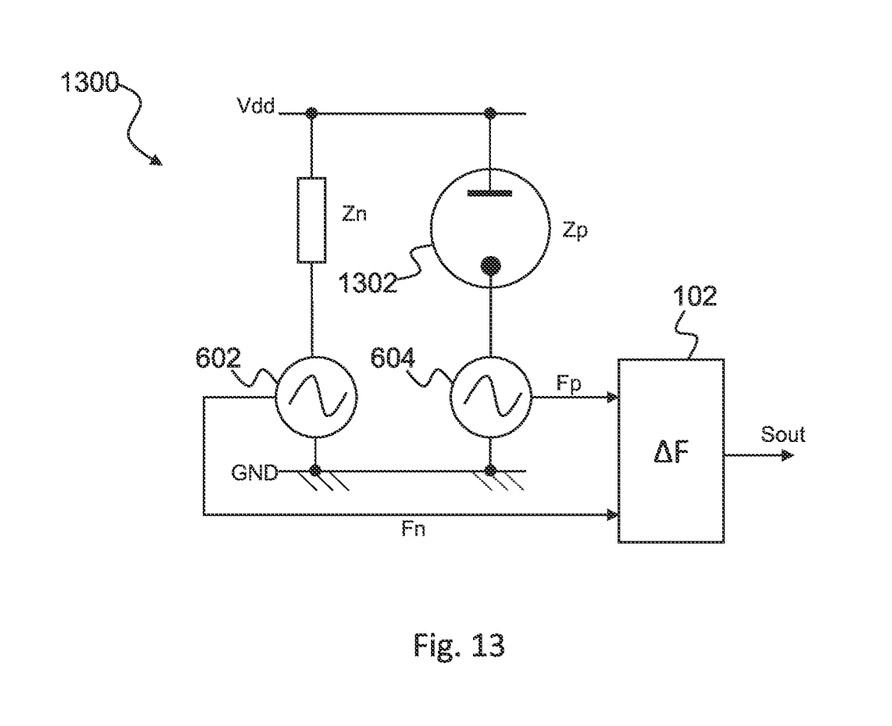
FIG. 13 illustrates an example implementation of the measurement circuit of FIG. 6 as an analyte sensor.

As mentioned above, the measurement circuits 300, 600, 1000, 1100 may be used to measure changes in impedance of one or more circuit elements provided therein. FIGS. 12 and 13 provided two examples of the use of measurement circuits described herein for the measurement of changes in impedance of electrochemical cells. As is known in the art, electrochemical cells can be used to measure concentrations of analytes present at electrodes of such cells. Generally, electrochemical cells consist of two or more electrodes configured for contact with an analyte whose concentration is to be ascertained. Such sensors may also comprise circuitry for driving one or more of the electrodes and for measuring a response at one or more of the electrodes. Changes in concentration of an analyte lead to changes in the impedance characteristics of such cells, which can be measured by the various measurement circuits described herein.

FIG. 12 is a schematic illustration of the measurement circuit 300, the impedance Z comprising an electrochemical cell 1202. Changes in impedance Z of the electrochemical cell 1202 will lead to a change in the output signal Sout from the counter 304.

FIG. 13 is a schematic illustration of the measurement circuit 600, the second impedance Zp comprises an electrochemical cell 1302. Changes in the impedance Zp of the electrochemical cell 1302 are translated into changes in the output signal Sout from the difference module 606.

Figure 14:
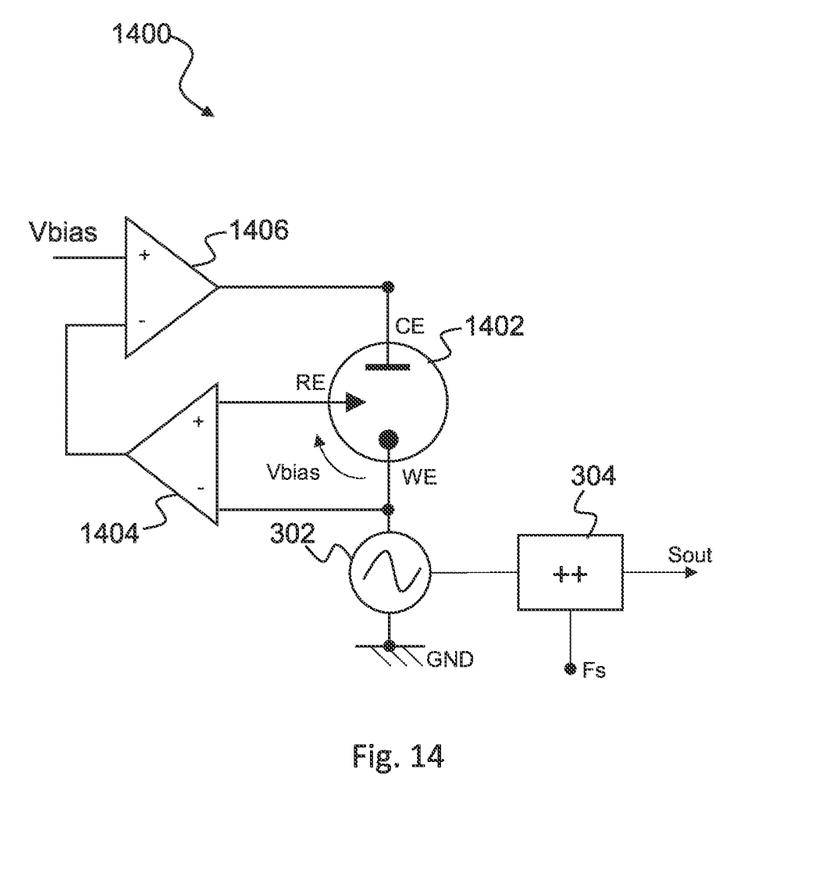
FIG. 14 illustrates a measurement circuit for an electrochemical cell according to embodiments of the present disclosure.

FIG. 14 is a schematic illustration of a measurement circuit 1400 which is a variation of the measurement circuit 300 of FIG. 3, specifically for use with an electrochemical cell 1402. Like parts have been given like numberings. The electrochemical cell comprises three electrodes, namely a counter electrode CE, a working electrode WE and a reference electrode RE. In addition to the VCO 302 and the counter 302, the circuit 1400 comprises a first comparator 1404 and a second comparator 1406. First and second (e.g. inverting and non-inverting) inputs of the first comparator 1404 are coupled to the reference electrode RE and the working electrode WE respectively. An output of the first comparator 1404 is coupled to a first (inverting) input of the second comparator 1406. A bias voltage Vbias is provided to the second (non-inverting) input of the second comparator 1406 whose output is provided to the counter electrode CE.

To determine a characteristic of the electrochemical cell 1402, and therefore an analyte concentration, a measurement current is injected by the second comparator 1406 at the counter electrode CE and a current at the working electrode WE is measured. The current flow through the VCO 302 is proportional to this current at the working electrode WE. The reference electrode RE is used to measure a voltage drop between the working electrode WE and the reference electrode RE. This voltage drop is measured by the first comparator 1404 which provides the result (i.e. the difference in voltage between the working and reference electrodes WE, RE) to the second comparator 1406. The second comparator 1406 then adjusts the voltage at the counter electrode CD to keep the voltage drop between the working electrode WE and the reference electrode RE constant. As the resistance in the cell 1402 increases, the voltage drop measured at the reference electrode increases. In response, the measurement current injected at the counter electrode CE is decreased. Likewise, as the resistance in the cell 1402 decreases, the voltage drop measured at the reference electrode decreases. In response, the measurement current injected at the counter electrode CE is increased. Thus the electrochemical cell 1402 reaches a state of equilibrium where the voltage drop between the reference electrode RE and the working electrode WE is maintained constant.

Figure 15:
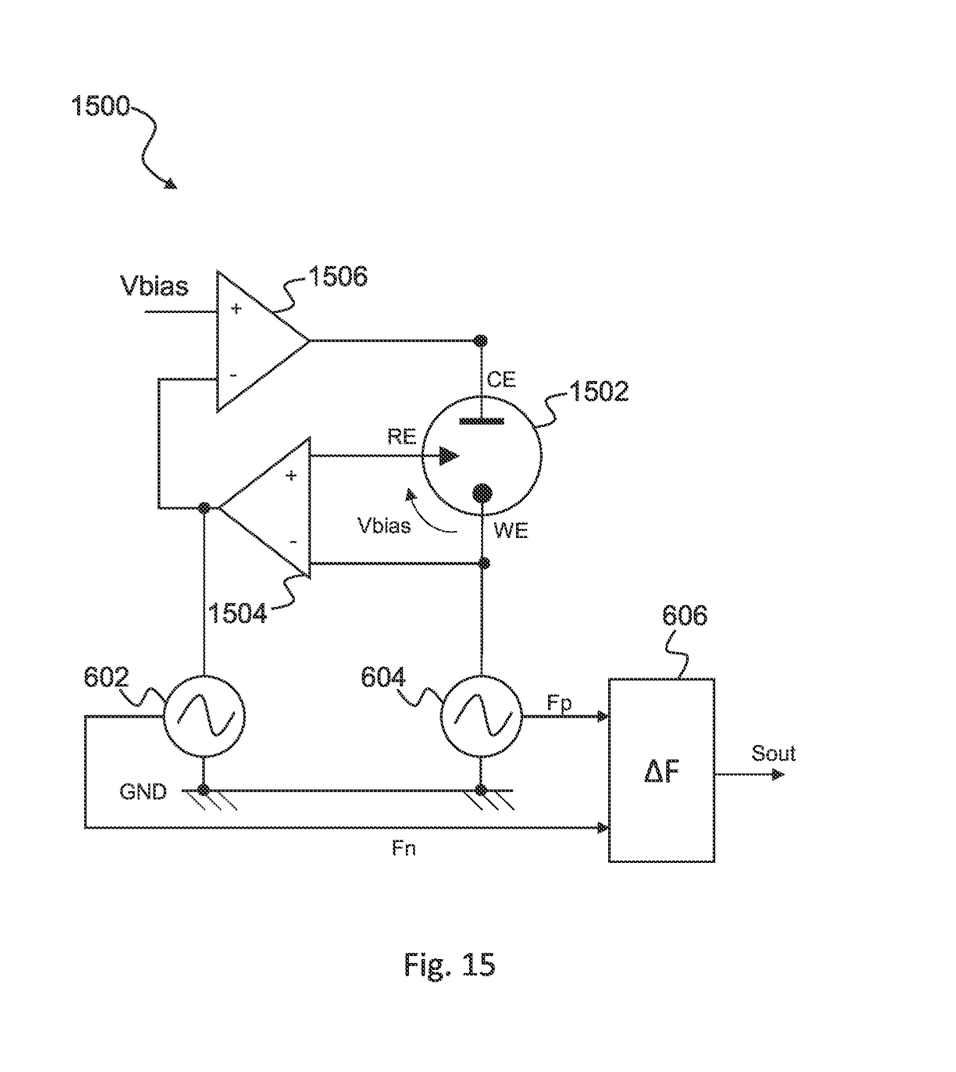
FIG. 15 illustrates a measurement circuit for an electrochemical cell according to embodiments of the present disclosure.

FIG. 15 is a schematic illustration of a measurement circuit 1500 which is a variation of the measurement circuit 600 of FIG. 6, specifically for use with an electrochemical cell 1502. Like parts have been given like numberings. The electrochemical cell comprises three electrodes, namely a counter electrode CE, a working electrode WE and a reference electrode RE. In addition to the first and second VCOs 602, 604 and the difference module 606, the circuit 1500 comprises a first comparator 1504 and a second comparator 1506. First and second (e.g. inverting and non-inverting) inputs of the first comparator 1504 are coupled to the reference electrode RE and the working electrode WE respectively. An output of the first comparator 1504 is coupled to a first (inverting) input of the second comparator 1506. A bias voltage Vbias is provided to the second (non-inverting) input of the second comparator 1506 whose output is provided to the counter electrode CD. The first VCO 602 is coupled between the reference voltage (e.g. ground (GND)) and the output of the first comparator 1504.

To determine a characteristic of the electrochemical cell 1502, and therefore an analyte concentration, a measurement current is injected by the second comparator 1506 at the counter electrode CE and a current at the working electrode WE is measured by the second VCO 302 (the current flow through the VCO 302 is proportional to this current at the working electrode WE). The reference electrode RE is used to measure a voltage drop between the working electrode WE and the reference electrode RE. This voltage drop is measured by the first comparator 1404 which provides the result (i.e. the difference in voltage between the working and reference electrodes WE, RE) to the second comparator 1406 and also to the supply rail of the first VCO 602. The second comparator 1406 then adjusts the voltage at the counter electrode CD to keep the voltage drop between the working electrode WE and the reference electrode RE constant. As the resistance in the cell 1402 increases, the voltage drop measured at the reference electrode increases. In response, the frequency of oscillation of the first VCO 602 increases and the measurement current injected at the counter electrode CE is decreased. Likewise, as the resistance in the cell 1402 decreases, the voltage drop measured at the reference electrode decreases. In response, the frequency of oscillation of the first VCO 602 decreases and the measurement current injected at the counter electrode CE is increased. Thus the electrochemical cell 1402 reaches a state of equilibrium where the voltage drop between the reference electrode RE and the working electrode WE is maintained constant.

Figure 16:
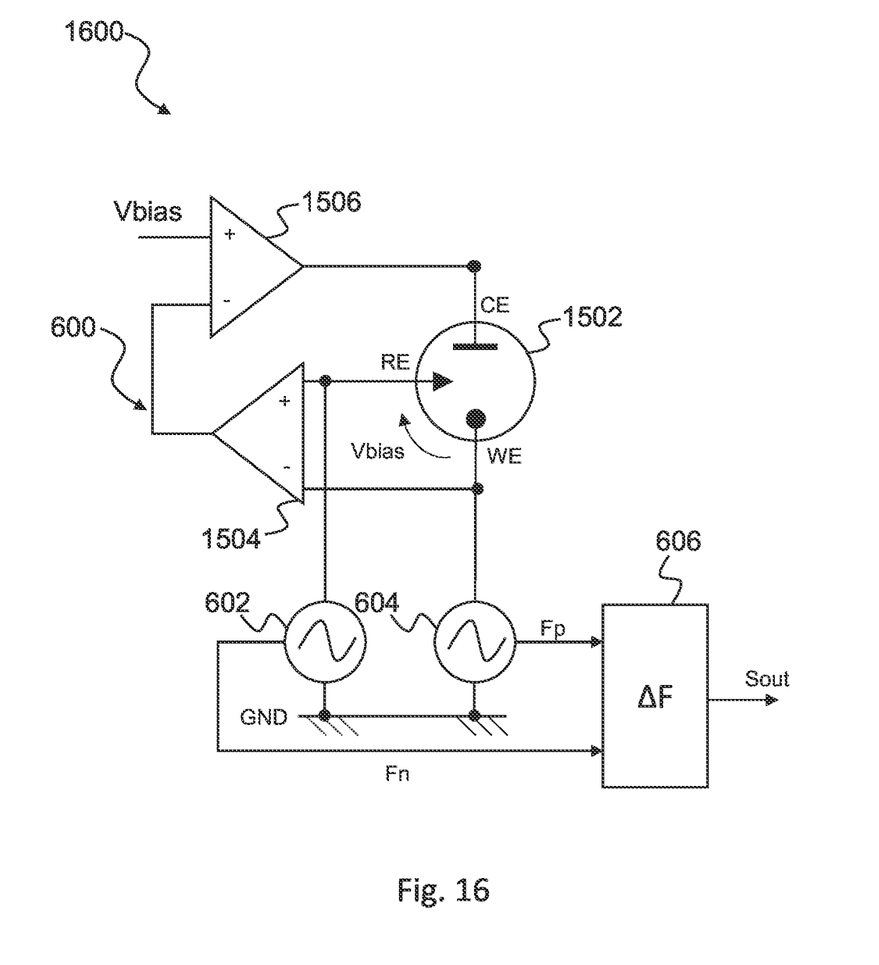
FIG. 16 illustrates a measurement circuit for an electrochemical cell according to embodiments of the present disclosure.

FIG. 16 shows a measurement circuit 1600 which is a variation of the circuit 1500 shown in FIG. 15, like parts having been given like numerals. The measurement circuit 1600 differs from that in FIG. 15 in that the first VCO 602 is coupled between the reference voltage (e.g. ground (GND)) and the second (non-inverting) input of the first comparator 1504 (rather than the output of the first comparator 1504). Like in the measurement circuit 1500 of FIG.

15, the frequency oscillation of the first VCO 602 is dependent on the voltage at the reference electrode RE.

The electrochemical cells 1202, 1302, 1402, 1502 may be engineered to monitor for one or more analytes. Such analytes may include one or more of ketones, oxygen, lactate and glucose.

As mentioned above with reference to the measurement circuit 600 of FIG. 6, there may be some mismatch between left and right half bridges (e.g. the left and right VCOs 602, 604) of the measurement circuit 600. To account for such mismatch, in some embodiments the first and second VCOs 602, 604 may be rotated between the first and second impedances Zn, Zp. In doing so, the effective gain k of each side of the bridge is equal to the average of the gain k of the two VCOs 602, 604.

Figure 17:
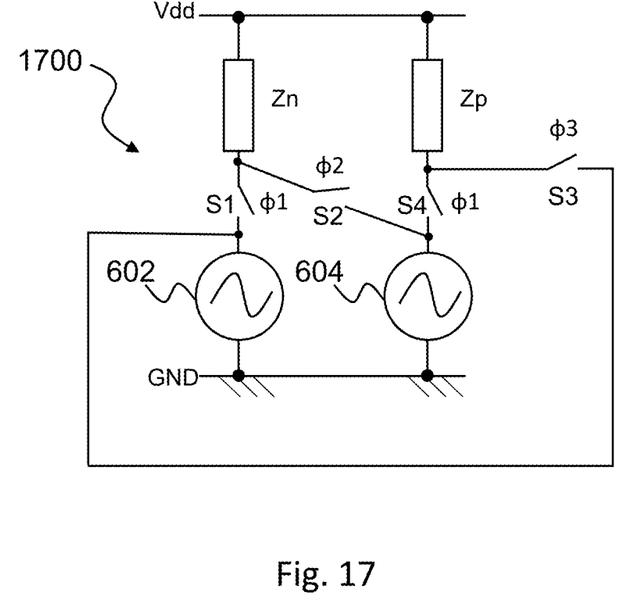
FIG. 17 illustrates a dynamic switching regime for the measurement circuit of FIG. 6.

FIG. 17 illustrates example switching circuitry 1700 for rotating connection of the VCOs 602, 604 between the first and second impedances Zn, Zp. The switching circuitry comprises a first switch S1 coupled between the first impedance Zn and the first VCO 602, a second switch S2 coupled between the first impedance Zn and the second VCO 604, a third switch S3 coupled between the second impedance Zp and the first VCO 602, and a fourth switch S4 coupled between the second impedance Zp and the second VCO 604. The switches S1:S4 are controlled such that, during a first phase, the first and second VCOs 602, 604 are connected respectively to the first and second impedances Zn, Zp and, during a second phase, the first VCO 602 is connected to the second impedance Zp and the second VCO 604 is connected to the first impedance Zn. It will be appreciated that one or more elements of the switching circuitry 1700 shown in FIG. 17 could equally be used for rotating connection of VCOs in any one of the measurement circuits 600, 1000, 1100, 1300, 1500, 1600 described above.

It will be appreciated that voltage-controlled oscillators such as the ring oscillator 200 shown in FIG. 2, are typically implemented with MOSFET semiconductor topology. MOSFETs can be biased to operate in a plurality of different modes. A conventional mode of operation for implementing VCOs is the fully saturated mode where both $V_{GS} > V_T$ and $V_{DS} > V_{GS} - V_T$, where $V_{GS}$ is the gate-source voltage, $V_T$ is the threshold, and $V_{DS}$ is the drain-source voltage of the transistor. However, for low power operations, a subthreshold mode, where $V_{GS} < V_T$, may be used which substantially reduces the power consumption of the MOSFET devices making up the VCO. In this mode of operation, the current for low Vos is approximately given by:

$$\varphi(V) = I_0 \frac{W}{L} e^{\left(\frac{V}{nV_T}\right)}$$

Where:

$$I_0 = 10^{-9} A$$

$$n = 1.4$$

$$V_T = \frac{kT}{9} = 26mV$$

Figure 18:
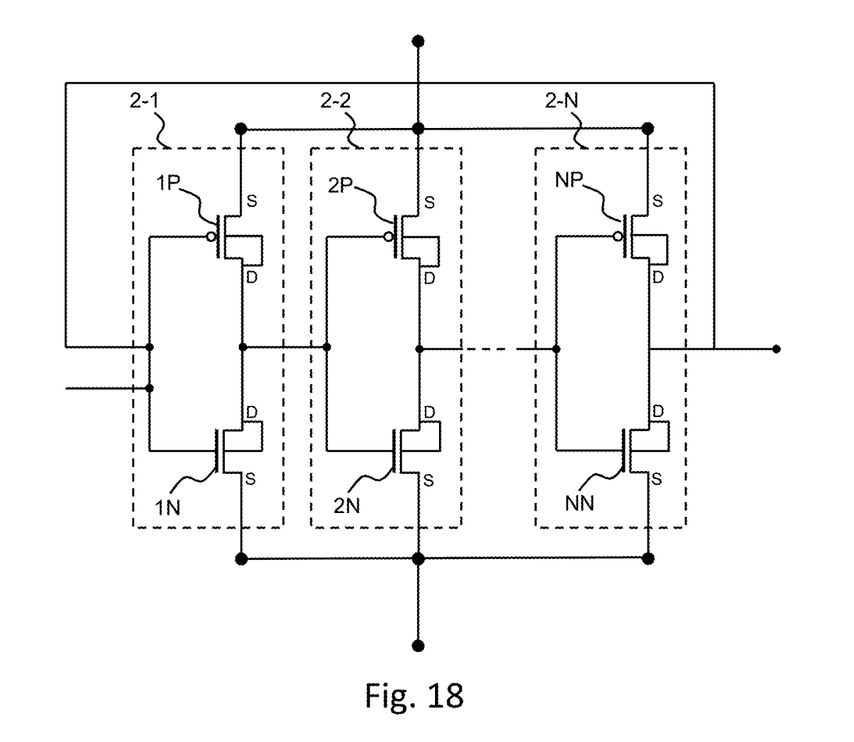
FIG. 18 illustrates an example implementation of the voltage-controlled ring oscillator shown in FIG. 2.

FIG. 18 illustrates a novel implementation of the VCO 200 of FIG. 2 for operation in a subthreshold mode. In contrast, in FIG. 18, each of the inverters 2-1, 2-2, 2-N comprises a p-type MOSFET 1P, 2P, NP and an n-type MOSFET 1N, 2N, NN. In a conventional inverter implementations, respective MOSFET bulks are connected to their sources. In contrast to convention, bulks of the p-type MOSFETs 1P, 2P, NP are coupled to respective drains of the p-type MOSFETs 1P, 2P, NP. Additionally, again in contrast to convention, bulks of the n-type MOSFETs 1N, 2N, NN are coupled to respective drains of the n-type MOSFETs 1N, 2N, NN. Pulling the bulk of the n-type devices high and the p-type devices low when operating in the subthreshold mode results in a reduction in threshold voltage $V_T$ for each of the devices.

Figures 19, 20:
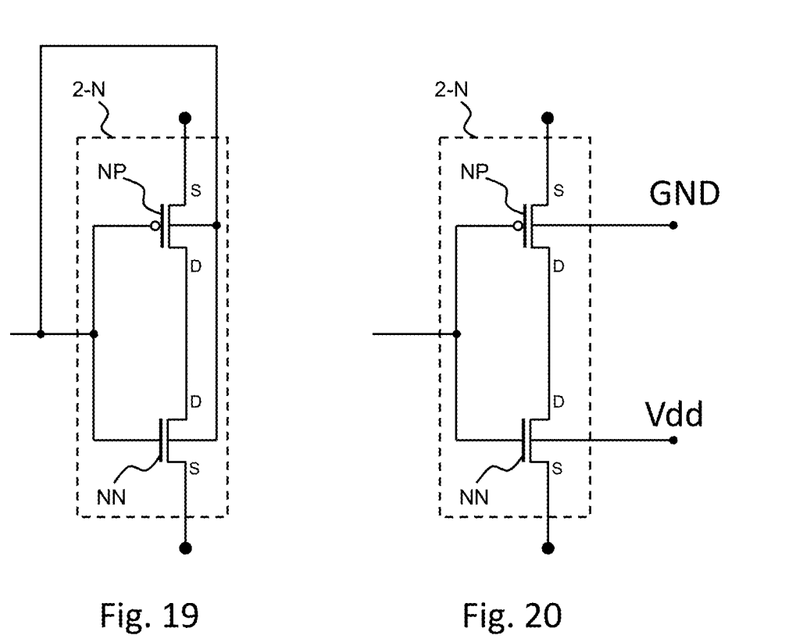
FIGS. 19 and 20 illustrate variations of bulk biasing for an inverter of the ring oscillator shown in FIG. 18.

FIGS. 19 and 20 two variations for a single inverter 2-N which may be repeated for all inverters in the oscillator shown in FIG. 18.

In FIG. 19 a dynamic body biasing variation is shown in which the bulk of each of the MOSFETS NP, NN is coupled to the gate of the inverter 2-N which in turn is driven by a previous inverter in the ring oscillator 200.

In FIG. 20, the bulk of the p-type MOSFET is pulled low, in this case to ground GND and the n-type MOSFET is pulled high, in this case to the supply voltage Vdd.

In each example shown in FIG. 18 to 20, the body effect is used to increase the speed of switching of the ring oscillator 200. Specifically, in each example, it is proposed to pull the voltage at the bulk to a different potential, thereby adjusting the threshold voltage, Vt, of the respective MOSFETs, to either speed up or slow down the VCO 200.

It will be appreciated that the VCOs described herein may be switchable to operate in a fully saturated mode for higher performance but higher power consumption, and in a subthreshold mode for lower performance but lower power consumption depending on power and performance requirements.

Figure 21:
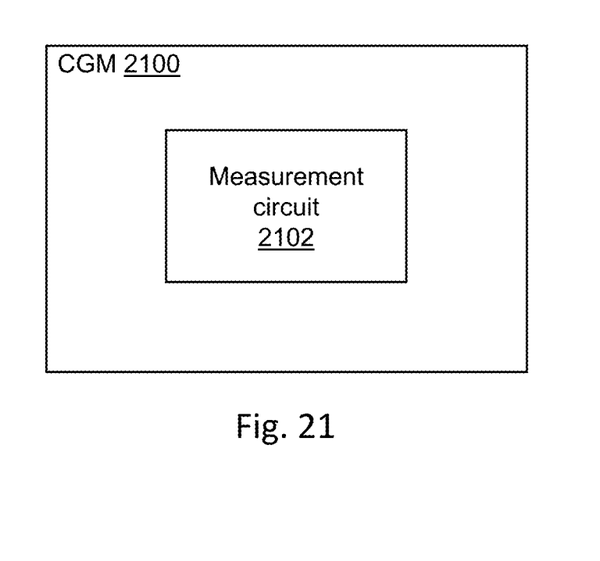
FIG. 21 is a schematic diagram of a continuous glucose monitor comprising a measurement circuit.

FIG. 21 illustrates a continuous glucose monitor (CGM) 2100 comprising a measurement circuit 2102 as described above.

As mentioned previously, the power consumption of the various measurement circuits described above is substantially reduced when compared to state-of-the art measurement circuits. Additionally, various embodiments described above are smaller in size and thus take up less circuit real estate. By reducing the size and power of drive and measurement circuitry, the overall performance of such circuitry is improved. This has particular advantages for application in battery operated systems. When sensors are battery powered, for example when used for analyte sensing (e.g. continuous glucose monitoring), it is desirable for such sensors to be as small as possible and use as little power as possible. For analyte monitoring applications, the reduced size and power consumption also means that multiple electrochemical sensors can be integrated into a single device, thereby either providing redundancy or enabling the sensing of multiple analytes in a single chip. This may be particularly advantageous in applications such as continuous glucose monitoring, where it may be desirable to measure concentrations of several analytes including but not limited to two or more of glucose, ketones, oxygen, lactate, and the like.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote-control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Measurement circuitry, comprising:
   an input voltage node;
   a reference voltage node;
   an output node; and
   a first half-bridge comprising:
      a first electrochemical sensor configured to sense one or more analytes; and
      a first voltage-controlled oscillator (VCO);
   wherein the first-half bridge is coupled between the input voltage node and the reference voltage node, wherein the first electrochemical sensor is coupled in series with the first VCO between the input voltage node and the reference voltage node, and wherein the first VCO is configured to output a first oscillating signal having a first frequency via the output node and wherein the first frequency is proportional to a current flowing from the input voltage node to the reference voltage node.

2. The measurement circuitry of claim 1, further comprising:
   a first counter, comprising:
      a data input node for receiving the first oscillating signal;
      a clock input node for receiving a clock signal; and
      a counter output node, wherein the data input node is clocked by the clock signal.

3. The measurement circuitry of claim 1, further comprising:
   a second half bridge, comprising:

a first circuit element having a first impedance, wherein the first circuit element is coupled between the input voltage node and a first node; and a second circuit element having a second impedance, wherein the second circuit element is coupled between the first node and the reference voltage node, and wherein the first circuit element or the second circuit element comprises a second voltage-controlled oscillator (VCO) having a second input node coupled to the second node and a second output node for outputting a second oscillating signal having a second frequency.

4. The measurement circuitry of claim 3, wherein the first circuit element comprises a second electrochemical sensor.

5. The measurement circuitry of claim 3, further comprising:
a difference module configured to:
receive the first and second oscillating signals; and
generate a difference signal proportional to a difference between the first and second frequencies.

6. The measurement circuitry of claim 5, wherein the difference module comprises:
a first counter having a first data input node for receiving the first oscillating signal and a first clock input node for receiving a clock signal, wherein the first counter is configured to generate a first count signal;
a second counter having a second data input node for receiving the second oscillating signal and a second clock input node for receiving the clock signal, wherein the second counter is configured to generate a second count signal; and
a subtraction module configured to generate the difference signal by subtracting the first count signal from the second count signal or by subtracting the second signal from the first count signal.

7. The measurement circuitry of claim 6, further comprising a gain compensation module comprising:
an adder configured to generate a common mode signal by adding the first and second count signals; and wherein the gain compensation module is configured to normalise a gain in the difference signal using the common mode signal.

8. The measurement circuitry of claim 7, wherein the first electrochemical sensor has an electrochemical sensor impedance and the gain is defined $$k = \frac{2V_{in} - S_{cm}}{2Z_0 * V_{in}^2}$$

wherein $V_{in}$ is the input voltage, $S_{cm}$ is the common mode signal, and $Z_0$ is either the electrochemical sensor impedance or the first impedance.

9. The measurement circuitry of claim 6, wherein the first VCO has a first gain and the second VCO has a second gain and the measurement circuitry further comprises:

a first linearisation module configured to linearise the first count signal based on the input voltage and the first gain;
a second linearisation module configured to linearise the second count signal based on the input voltage and the second gain.

10. The measurement circuitry of claim 3, further comprising:
a counter, comprising:
a data input node configured to receive the first oscillating signal; and
a clock input node configured to receive the second oscillating signal, wherein the data input node is clocked by the clock input node.

11. The measurement circuitry of claim 10, further comprising:
a frequency divider configured to frequency divide the first oscillating signal or the second oscillating signal by a denominator.

12. The measurement circuitry of claim 3, wherein the first and second half bridges form an unbalanced bridge.

13. The measurement circuitry bridge of claim 1, wherein the first VCO comprises a plurality of metal-oxide semiconductor field-effect transistors (MOSFETs) and the measurement circuitry is configured to operate in a low-power mode wherein the plurality of MOSFETs operates in a subthreshold region.

14. The measurement circuitry of claim 13, wherein the plurality of MOSFETS comprises at least one n-channel metal-oxide semiconductor (NMOS) device having a bulk and a drain connected to the bulk.

15. The measurement circuitry of claim 13, wherein the plurality of MOSFETS comprises at least one p-channel metal-oxide semiconductor (PMOS) device having a bulk and a source connected to the bulk.

16. The measurement circuitry of claim 1, wherein the first VCO comprises a ring oscillator.

17. The measurement circuitry of claim 1, wherein the one or more analytes comprise glucose, a lactate molecule or a ketone molecule, or a combination thereof.

18. A continuous glucose monitor comprising a measurement circuitry comprising:
an input voltage node;
a reference voltage node;
an output node; and
a first half-bridge comprising:
a first electrochemical sensor configured to sense one or more analytes; and
a first voltage-controlled oscillator (VCO);
wherein the first-half bridge is coupled between the input voltage node and the reference voltage node, wherein the first electrochemical sensor is coupled in series with the first VCO between the input voltage node and the reference voltage node, and wherein the first VCO is configured to output a first oscillating signal having a first frequency via the output node and wherein the first frequency is proportional to a current flowing from the input voltage node to the reference voltage node.

* * * * *